(12) United States Patent
Kim et al.

(10) Patent No.: US 7,557,602 B2
(45) Date of Patent: Jul. 7, 2009

(54) PRE-EMPHASIS CIRCUIT INCLUDING SLEW RATE CONTROLLABLE BUFFER

(75) Inventors: Chi-Won Kim, Hwascong-si (KR); Myoung-Bo Kwak, Seoul (KR); Jong-Shin Shin, Anyang-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 61 days.

(21) Appl. No.: 11/506,652

(22) Filed: Aug. 18, 2006

(65) Prior Publication Data
US 2007/0046350 A1 Mar. 1, 2007

(30) Foreign Application Priority Data
Aug. 25, 2005 (KR) .................. 10-2005-0078420

(51) Int. Cl.
H03K 17/16 (2006.01)
H03K 19/003 (2006.01)
H03K 4/06 (2006.01)

(52) U.S. Cl. .................. 326/26; 326/30; 327/140
(58) Field of Classification Search ............. 326/26–27, 326/83, 86, 89, 115, 121, 127; 327/108–109
See application file for complete search history.

(56) References Cited
U.S. PATENT DOCUMENTS 6,417,790 B1 * 7/2002 Fiedler et al. ............... 341/101
6,956,442 B2 * 10/2005 Groen et al. ................ 331/57
7,148,726 B2 * 12/2006 Oka et al. ................... 326/86
7,288,967 B2 * 10/2007 Byun et al. ................. 326/83

FOREIGN PATENT DOCUMENTS

| JP | 2001-057576 | 2/2001 |
| JP | 2004-088693 | 3/2004 |
| KR | 1020040055903 A | 6/2004 |
| KR | 1020050062036 A | 6/2005 |

* cited by examiner

Primary Examiner—Vibol Tan
Assistant Examiner—Dylan White
(74) Attorney, Agent, or Firm—F. Chau & Assoc., LLC

(57) ABSTRACT

A pre-emphasis circuit capable of controlling the slew rate of a signal output from a buffer that transfers the output signal to an output driver to increase the range of a controllable voltage step includes a first buffer, a second buffer, and an output driver. The first buffer buffers first and second main input signals having phases opposite to each other, outputs first and second main output signals, and controls slew rates of the first and second main output signals using at least one main control signal. The second buffer buffers first and second sub-input signals having phases opposite to each other, outputs first and sub-output signals, and controls slew rates of the first and second sub-output signals using at least one sub-control signal. The output driver generates first and second output signals having opposite phases using at least two control signals and the output signals of the first and second buffers.

16 Claims, 8 Drawing Sheets

PRE-EMPHASIS CIRCUIT INCLUDING SLEW RATE CONTROLLABLE BUFFER

CROSS-REFERENCE TO RELATED PATENT APPLICATION

This application claims benefit of Korean Patent Application No. 10-2005-0078420, filed on Aug. 25, 2005, in the Korean Intellectual Property Office, the disclosure of which is incorporated herein in its entirety by reference.

BACKGROUND OF THE INVENTION

1. Technical Field

The present disclosure relates to a pre-emphasis circuit and, more particularly, to a pre-emphasis circuit including a buffer capable of controlling the slew rate of an output signal.

2. Discussion of the Related Art

It is known that a transmitter can transmit two signals having a phase difference of 180° between them to a receiver to minimize the influence of noise introduced into the signals. The two signals form a specific eye pattern or eye diagram if the two signals overlap each other. This eye pattern is deformed when the signals are distorted due to noise introduced into the signals while the signals are transmitted. A signal is transmitted and received between the transmitter and the receiver via a transmission line. Frequently, a high-frequency component included in the transmitted/received signal will be cut off because the transmission line has a low pass band filter characteristic. The low pass filter characteristic of the transmission line is generally caused by interaction of a resistive component of the transmission line and a capacitive load existing between the transmission line and a ground voltage. Thus, the amplitude of the high-frequency component of the transmitted/received signal is reduced, while a low-frequency component thereof is not changed.

Since the high-frequency component of the transmitted/received signal is reduced, the eye pattern of the received signal is different from a normal eye pattern. That is, the received signal has a jitter component referred to as inter-symbol interference (ISI) jitter. To remove the ISI jitter, an operation of initially increasing the amplitude of the high-frequency component of the signal and transmitting the increased signal so that the original amplitude of the high-frequency component will be maintained even when it is reduced due to the low pass filter characteristic of the transmission line should be carried out. This amplitude increasing operation is referred to as pre-emphasis.

FIG. 1 illustrates a conventional pre-emphasis circuit. Referring to FIG. 1, the pre-emphasis circuit includes a first buffer 110, a second buffer 120, and an output driver 130. The first buffer 110 buffers two main signals having a phase difference of 180° between them and outputs first and second main signals VP and VN to the output driver 130. The second buffer 120 buffers two sub signals having a phase difference of 180° between them and outputs first and second sub-signals VP1 and VN1 to the output driver 130. The output driver 130 outputs two signals OUT and OUTB having a phase difference of 180° in response to the four signals VP, VN, VP1 and VN1. The amplitudes of the two signals OUT and OUTB are controlled by two control signals CON1 and CON2 fed to the output driver 130.

The first sub-signal VP1 is delayed from the first main signal VP by one bit and the second sub-signal VN1 is delayed from the second main signal VP by one bit.

FIG. 2 is a circuit diagram of the output driver 130 of FIG. 1. Referring to FIG. 2, the output driver 130 generates the signals OUT and OUTB having a phase difference of 180° between them in response to the four input signals VP, VN, VP1 and VN1. To pre-emphasize the signals OUT and OUTB, the currents flowing through two current sources Im and Is should be controlled using the two control signals CON1 and CON2. When the currents flowing through current sources Im and Is are controlled in multiple stages, pre-emphasis can be effectively performed to various degrees.

The frequency of a digital signal is reflected in the pulse width in the time domain. The frequency is high when the pulse width is narrow, and the frequency is low when the pulse width is wide. Accordingly, data having rapidly changing logic values becomes a high-frequency component and data having a more constant logic value becomes a low-frequency component.

FIG. 3 is a waveform diagram of signals of the output driver 130 of FIG. 2. FIG. 3 shows the second output voltage OUTB generated in response to the first main signal VP and the second sub signal VN1. The first sub signal VP1 is delayed from the first main signal VP by one bit and the first and second sub signals have a phase difference of 180° between them. When, as shown in FIG. 2, the first main signal VP and the second sub signal VN1 respectively applied to the gates of MOS transistors M1 and M3 are at a logic "1", the voltage of the second output node OUTB is considerably increased, as shown at (2) in FIG. 3. When one of the first main signal VP and the second sub signal VN1 is at a logic "1" and the other one is at a logic "0", the voltage of the second output node OUTB is only slightly increased, as shown at (1) in FIG. 3. When both the first main signal VP and the second sub signal VN1 are at a logic "0", the voltage of the second output node OUTB is not changed, as shown at (0) in FIG. 3. The voltage of the first output node OUT has a phase opposite to the phase of the second output signal OUTB so that an explanation thereof is omitted.

The amplitudes of high-frequency components of the signals output from the first and second output nodes OUT and OUTB are reduced when the signals are transmitted via transmission lines. Thus, pre-emphasis for increasing the amplitudes of the high-frequency components is carried out on the signals before transmitting the signals via the transmission lines.

Referring to FIG. 3, the bold portions of the signal waveform of the second output node OUTB represent a high-frequency component whose amplitude should be increased. To increase the amplitude of the high-frequency component, it is required that many voltage steps be controlled by the control signals CON1 and CON2 used in the output driver 130 of FIG. 2. That is, the number of control signals should be increased. The range of voltage steps controllable by the control signals CON1 and CON2, however, is narrow when only the two control signals CON1 and CON2 are used in the output driver 130.

SUMMARY OF THE INVENTION

Exemplary embodiments of the present invention provide a pre-emphasis circuit capable of controlling the slew rate of an output signal of a buffer that transfers the output signal to an output driver to increase the range of a controllable voltage step.

According to an exemplary embodiment of the present invention, there is provided a pre-emphasis circuit including a first buffer, a second buffer, and an output driver. The first buffer buffers first and second main input signals having phases opposite to each other, outputs first and second main output signals, and controls slew rates of the first and second main output signals using at least one main control signal. The second buffer buffers first and second sub-input signals having phases opposite to each other, outputs first and sub-output signals, and controls slew rates of the first and second sub-output signals using at least one sub-control signal. The output driver generates first and second output signals having opposite phases using at least two control signals and the output signals of the first and second buffers.

The first sub-input signal is delayed from the first main input signal by one bit and the second sub-input signal is delayed from the second main input signal by one bit.

BRIEF DESCRIPTION OF THE DRAWINGS

Exemplary embodiments of the present invention will be understood in more detail from the following descriptions taken in conjunction with the attached drawings in which.

DETAILED DESCRIPTION OF EXEMPLARY EMBODIMENTS

Figure 1:
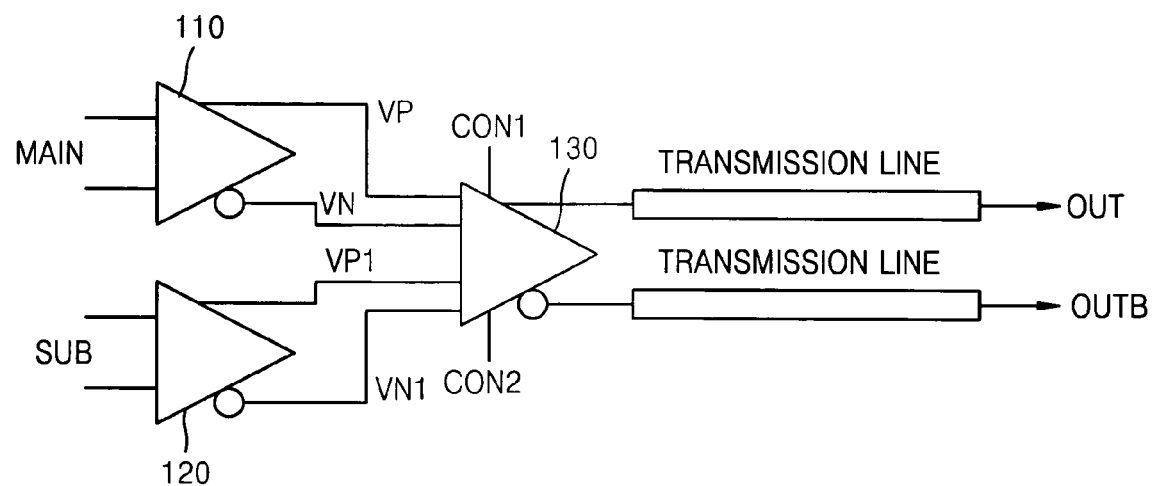
FIG. 1 illustrates a configuration of a conventional pre-emphasis circuit.
Figure 2:
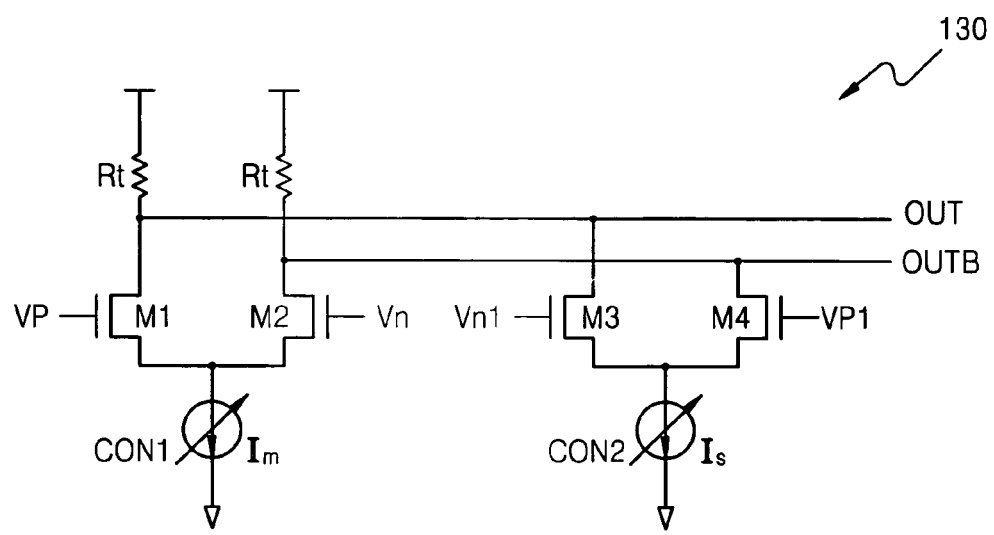
FIG. 2 is a circuit diagram of an output driver of FIG. 1.
Figure 3:
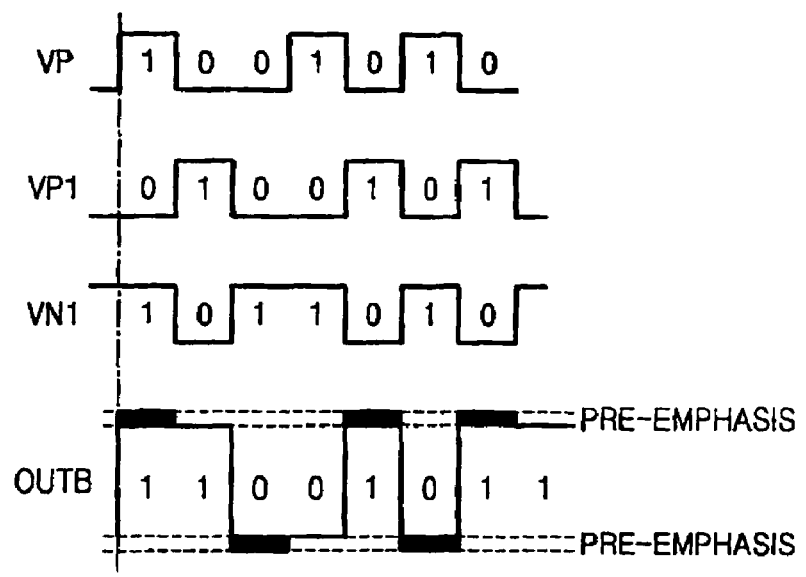
FIG. 3 is a waveform diagram of internal signals of the output driver of FIG. 2.

The present invention will now be described more fully with reference to the accompanying drawings, in which exemplary embodiments of the invention are shown. The invention may, however, be embodied in many different forms and should not be construed as being limited to the exemplary embodiments set forth herein; rather, these exemplary embodiments are provided so that this disclosure will be thorough and complete, and will fully convey the concept of the invention to those skilled in the art. Throughout the drawings, like reference numerals refer to like elements.

Figure 4:
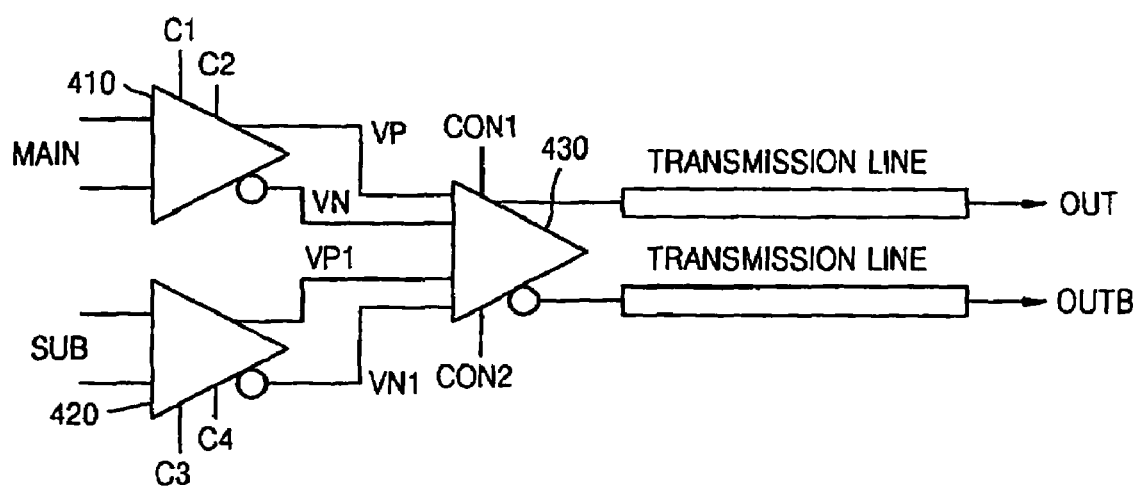
FIG. 4 illustrates a configuration of a pre-emphasis circuit according to an exemplary embodiment of the present invention.

FIG. 4 illustrates a configuration of a pre-emphasis circuit according to an exemplary embodiment of the present invention. Referring to FIG. 4, the pre-emphasis circuit includes a first buffer 410, a second buffer 420, and an output driver 430.

The first buffer 410 buffers first and second main input signals having phases opposite to each other and outputs first and second main output signals VP and VN. The first buffer 410 can control slew rates of the first and second main output signals VP and VN using at least one of main control signals C1 and C2 fed thereto. The second buffer 420 buffers first and second sub-input signals having phases opposite to each other and outputs first and second sub-output signals VP1 and VN1. The second buffer 420 can control slew rates of the first and second sub-output signals VP1 and VN1 using at least one of sub-control signals C3 and C4 fed thereto. The output driver 430 generates first and second output signals OUT and OUTB having phases opposite to each other using at least two control signals CON1 and CON2, from the first and second main output signals VP and VN of the first buffer 410, and the first and second sub-output signals VP1 and VN1 of the second buffer 420.

The first sub-input signal is delayed from the first main input signal VP by one bit and the second sub-input signal is delayed from the second main input signal by one bit. The pre-emphasis circuit may further include a controller (not shown) that outputs the main control signals C1 and C2, the sub-control signals C3 and C4, and the control signals CON1 and CON2.

The pre-emphasis circuit shown in FIG. 4 initially controls the slew rates of the signals output from the first and second buffers 410 and 420 using the main control signals C1 and C2 and the sub-control signals C3 and C4 and transfers the signals to the output driver 430. The output driver 430 performs pre-emphasis on the transferred signals.

The control of the slew rates, performed by the first and second buffers 410 and 420, is referred to as a first pre-emphasis because it provides the effect of pre-emphasis, and the pre-emphasis carried out by the output driver 430 is referred to as a second pre-emphasis. The absolute value of a voltage between steps of pre-emphasis when the first pre-emphasis and the second pre-emphasis control the steps using two control signals, respectively, is larger than the absolute value of the voltage between the steps of pre-emphasis when the second pre-emphasis controls the steps using four control signals.

Accordingly, when the first and second buffers 410 and 420 and the output driver 430 respectively perform pre-emphasis using the same number of control signals, the step size of pre-emphasis can become larger than the step size of pre-emphasis when only the output driver 430 carries out pre-emphasis using a plurality of control signals. This has an advantage of obtaining a pre-emphasis step larger than a linearly increased narrow pre-emphasis step obtained using a conventional technique.

Figure 5:
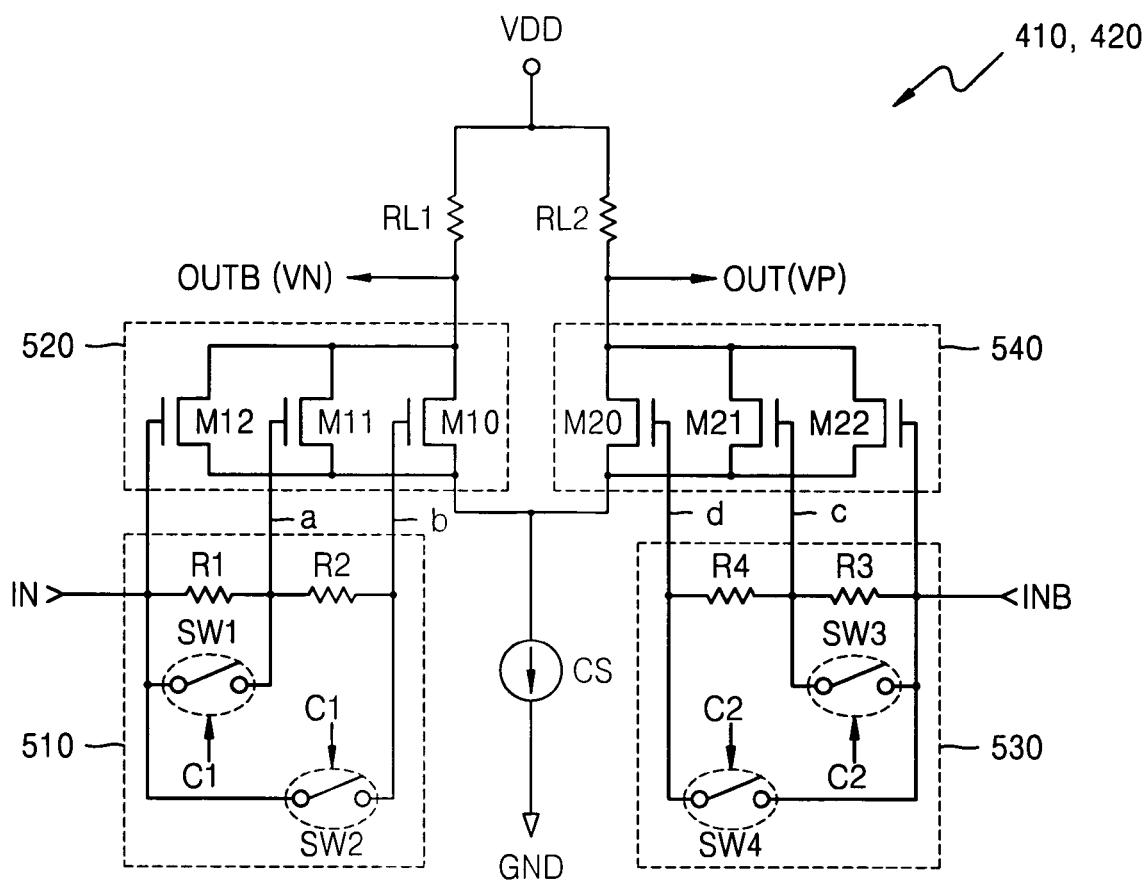
FIG. 5 is a circuit diagram of a buffer of the pre-emphasis circuit of FIG. 4.

FIG. 5 is a circuit diagram of the first buffer 410 or the second buffer 420 of FIG. 4. Assuming that the buffer of FIG. 5 is the first buffer 410 of FIG. 4, the first buffer 410 includes a first load resistor RL1, a second load resistor RL2, a first main input signal processor 510, a second main input processor 530, a first input stage 520, a second input stage 540, and a current source CS.

A first terminal of the first load resistor RL1 is connected to a first power supply VDD and a second terminal thereof is connected to a second output terminal OUTB outputting the second main output signal VN. A first terminal of the second load resistor RL2 is connected to the first power supply VDD and a second terminal is connected to a first output terminal OUT outputting the first main output signal VP.

The first main input signal processor 510 processes a first main input signal IN input thereto in response to a first main control signal C1 to generate at least two first group gate signals a and b. The first main input signal processor 510 includes a first resistor R1, a second resistor R2, a first switch SW1 and a second switch SW2. A first terminal of the first resistor R1 is connected to the signal line of the first main input signal IN and a second terminal thereof is connected to the signal line of the first gate signal a that is one of the first group gate signals. A first terminal of the second resistor R2 is connected to the second terminal of the first resistor R1 and a second terminal of second resistor R2 is connected to the signal line of the second gate signal b that is the other of the first group gate signals. The first switch SW1 switches between the first main input signal IN and the first group gate signal a in response to the first main control signal C1. The second switch SW2 switches between the first main input signal IN and the first group gate signal b in response to the first main control signal C1. The first and second switches SW1 and SW2 could also be controlled by different respective control signals.

The second main input signal processor 530 processes a second main input signal INB input thereto in resporise to a second main control signal C2 to generate at least two second group gate signals c and d. The second main input signal processor 530 includes a third resistor R3, a fourth resistor R4, a third switch SW3 and a fourth switch SW4. A first terminal of the third resistor R3 is connected to the signal line of the second main input signal INB and a second terminal thereof is connected to the signal line of the third gate signal c that is one of the second group gate signals. A first terminal of the fourth resistor R4 is connected to the second terminal of the third resistor R3 and the second terminal of the fourth resistor R4 is connected to the signal line of the fourth gate signal d that is the other of the second group gate signals. The third switch SW3 switches between the second main input signal INB and the third gate signal c in response to the second main control signal C2. The fourth switch SW4 switches between the second main input signal INB and the fourth gate signal d in response to the second main control signal C2. The third and fourth switches SW3 and SW4 could also be controlled by different respective control signals.

The first input stage 520 controls the current flowing from the first load resistor RL1 connected thereto in response to the first main input signal IN and the first group gate signals a and b. The first input stage 520 includes first, second and third MOS transistors M10, M11 and M12. A first terminal of the first MOS transistor M10 is connected to the second output terminal OUTB and a second terminal thereof is connected to the current source CS. The second gate signal b is applied to the gate of the first MOS transistor M10. A first terminal of the second MOS transistor M11 is connected to the second output terminal OUTB and a second terminal thereof is connected to the current source CS. The first gate signal a is applied to the gate of the second MOS transistor M11. A first terminal of the third MOS transistor M12 is connected to the second output terminal OUTB and a second terminal thereof is connected to the current source CS. The first main input signal IN is applied to the gate of the third MOS transistor M12.

The second input stage 540 controls the current flowing from the second load resistor RL2 connected thereto in response to the second main input signal INB and the second group gate signals c and d. The second input stage 540 includes fourth, fifth and sixth MOS transistors M20, M21 and M22. A first terminal of the fourth MOS transistor M20 is connected to the first output terminal OUT and a second terminal thereof is connected to the current source CS. The fourth gate signal d is applied to the gate of the fourth MOS transistor M20. A first terminal of the fifth MOS transistor M21 is connected to the first output terminal OUT and a second terminal thereof is connected to the current source CS. The third gate signal c is applied to the gate of the fifth MOS transistor M21. A first terminal of the sixth MOS transistor M22 is connected to the first output terminal OUT and a second terminal thereof is connected to the current source CS. The second main input signal INB is applied to the gate of the sixth MOS transistor M22.

The current source CS receives currents flowing from the first and second input stages 520 and 540 and transfers the currents to a second power supply through a ground connection GND.

The first through fourth switches SW1, SW2, SW3 and SW4 are composed of transmission gates and the first through sixth MOS transistors M10, M11, M12, M20, M21 and M22 are NMOS transistors.

The buffer 410 illustrated in FIG. 5 can control the slew rates of the signals output from the first and second output terminals OUT and OUTB according to the first and second main control signals C1 and C2. To simplify the explanation of the operation of this circuit, it is assumed that only the first main control signal C1 is applied to the first main input signal processor 510 and only the second main control signal C2 is applied to the second main input signal processor 530.

If the first and second switches SW1 and SW2 are closed by the first main control signal C1, the first main input signal IN is applied to the gates of the first, second and third MOS transistors M10, M11 and M12. If the third and fourth switches SW3 and SW4 are closed by the first main control signal C1, the second main input signal INB is applied to the gates of the fourth, fifth and sixth MOS transistors M20, M21 and M22.

Only the first main input signal processor 510 and the first input stage 520 operated by the first main control signal C1 are explained hereinafter because the second main input signal processor 530 and the second input stage 540 operated by the second main control signal C2 have the same operation characteristic as the first main input signal processor 510 and the first input stage 520.

If the first and second switches SW1 and SW2 are opened by the first main control signal C1, the second gate signal b, the first gate signal a and the first main input signal IN are respectively applied to the gates of the first, second and third MOS transistors M10, M11 and M12 due to the resistors R1 and R2 arranged between the switches SW1 and SW2.

It is understood, of course, that the construction and operation of the second buffer 420 is the same as described hereinabove in connection with the first buffer 410, except that control signals C3 and C4 are fed to the second buffer 420.

Figure 6:
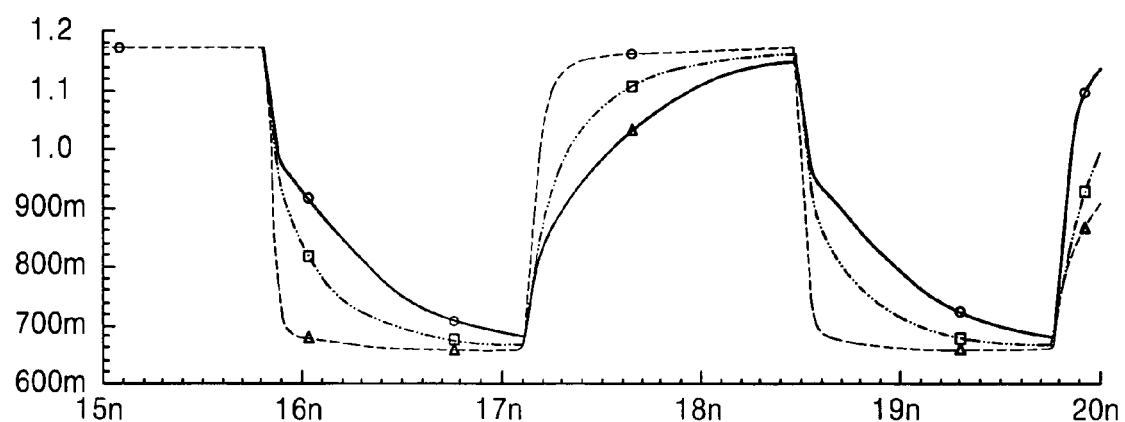
FIG. 6 is a waveform diagram of signals applied to the gates of MOS transistors M10, M11 and M12 when switches SW1 and SW2 of the buffer of FIG. 5 are opened.

FIG. 6 is a waveform diagram of signals applied to the gates of the first, second and third MOS transistors M10, M11 and M12 when the first and second switches SW1 and SW2 of the buffer 410 illustrated in FIG. 5 are opened in response to control signals C1 and C2. Referring to FIG. 6, the settling time of the first gate signal a applied to the gate of the second MOS transistor M11 is longer than that of the first main input signal IN applied to the gate of the third MOS transistor M12, and the settling time of the second gate signal b applied to the first MOS transistor M10 is longer than that of the first gate signal a applied to the gate of the second MOS transistor M11.

Figure 7:
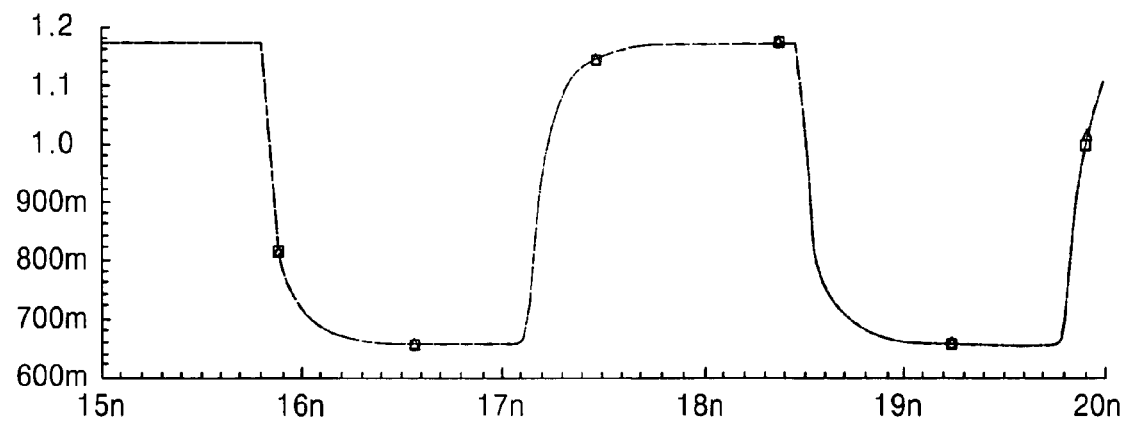
FIG. 7 is a waveform diagram of signals applied to the gates of the MOS transistors M10, M11 and M12 when the switches SW1 and SW2 of the buffer of FIG. 5 are closed.

FIG. 7 is a waveform diagram of signals applied to the gates of the first, second and third MOS transistors M10, M11 and M12 when the first and second switches SW1 and SW2 of the buffer 410 illustrated in FIG. 5 are closed. Referring to FIG. 7, it can be seen that the same signal is applied to the first, second and third MOS transistors M10, M11 and M12.

Figure 8A:
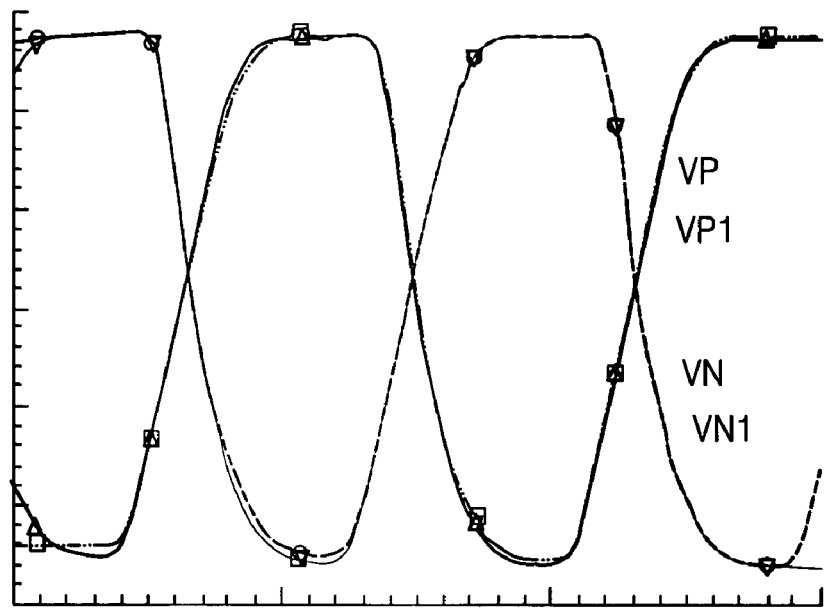
FIG. 8a is a waveform diagram of output signals of first and second buffers when C1=C2="L"
Figure 8B:
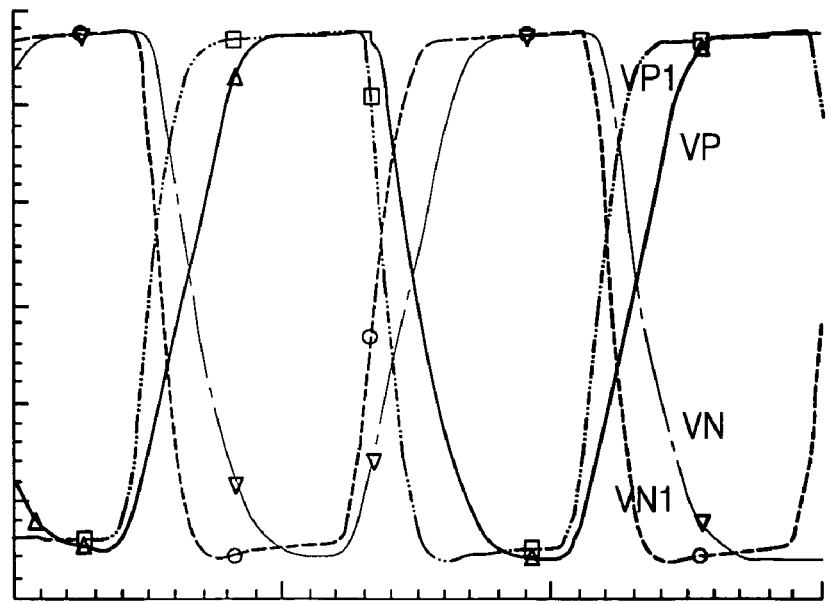
FIG. 8b is a waveform diagram of the output signals of the first and second buffers when C1="L" and C2="H"
Figure 8C:
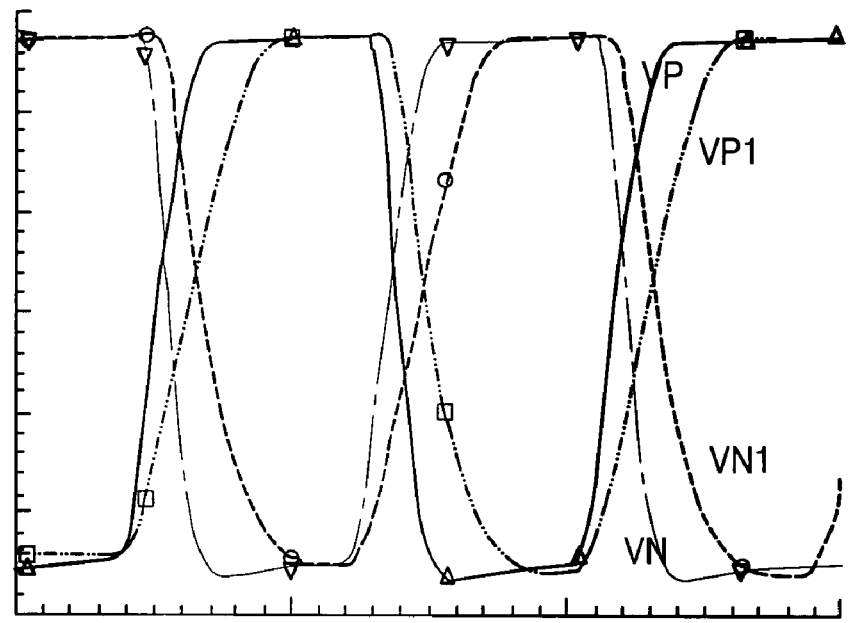
FIG. 8c is a waveform diagram of the output signals of the first and second buffers when C1="H" and C2="L"
Figure 8D:
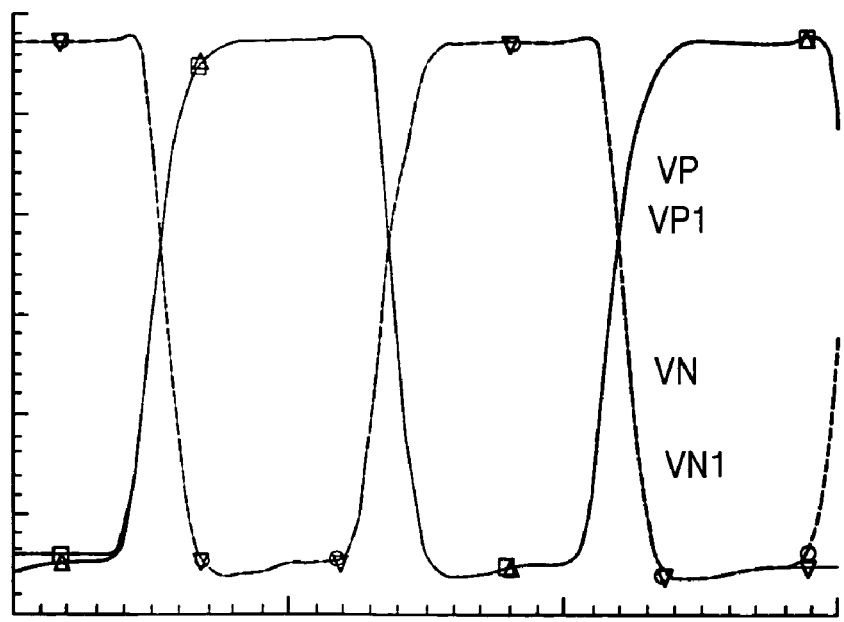
FIG. 8d is a waveform diagram of the output signals of the first and second buffers when C1=C2="H"

FIG. 8A is a waveform diagram of the output signals VP, VN, VP1 and VN1 of the first and second buffers 410 and 420 when C1=C2="L", FIG. 8B is a waveform diagram of the output signals VP, VN, VP1 and VN1 of the first and second buffers 410 and 420 when C1="L" and C2="H", FIG. 8C is a waveform diagram of the output signals VP, VN, VP1 and VN1 of the first and second buffers 410 and 420 when C1="H" and C2="L", and FIG. 8D is a waveform diagram of the output signals VP, VN, VP1 and VN1 of the first and second buffers 410 and 420 when C1=C2="H". When the first and second main control signals C1 and C2 have a value "L", corresponding switches SW2 and SW4 are opened. When the main control signals C1 and C2 have a value "H", corresponding switches SW2 and SW4 are closed.

Referring to FIGS. 8A, 8B, 8C, and 8D, the slew rates of the output signals VP, VN, VP1 and VN1 of the first and second buffers 410 and 420 are varied according to whether the switches SW2 and SW4 are opened or closed. The output signals VP, VN, VP1 and VN1 of the first and second buffers 410 and 420 have the lowest slew rates in the case of FIG. 8A, where C1=C2="L" and have the highest slew rates in the case of FIG. 8D, where C1=C2="H". FIGS. 8B and 8C show that the slew rate of the output signal of the buffer having switches closed is lower than the slew rate of the output signal of the buffer having switches opened.

Figure 9A:
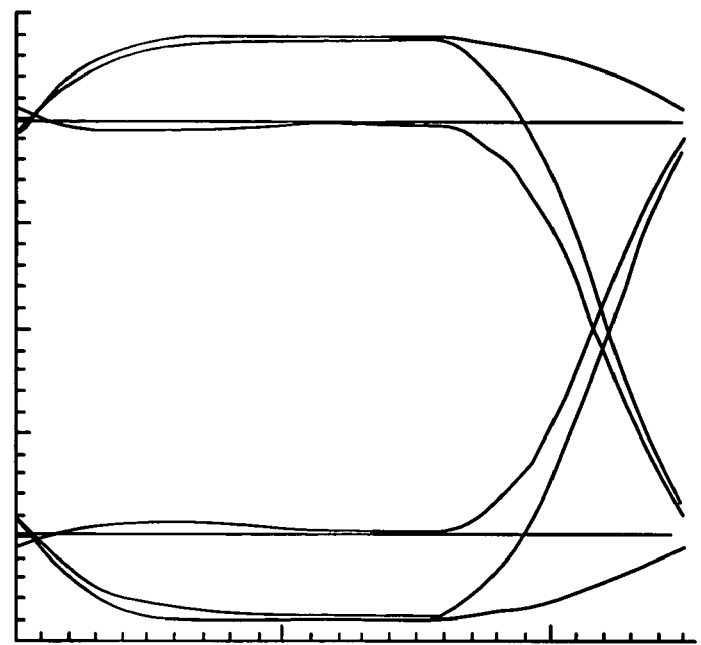
FIG. 9a is an eye diagram of two output signals of an output driver when C1=C2="L"
Figure 9B:
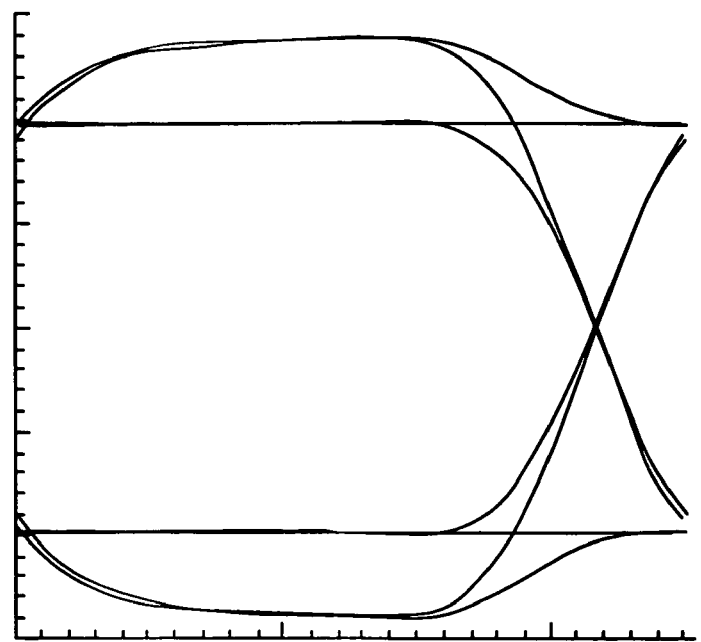
FIG. 9b is an eye diagram of the two output signals of the output driver when C1="L" and C2="H"
Figure 9C:
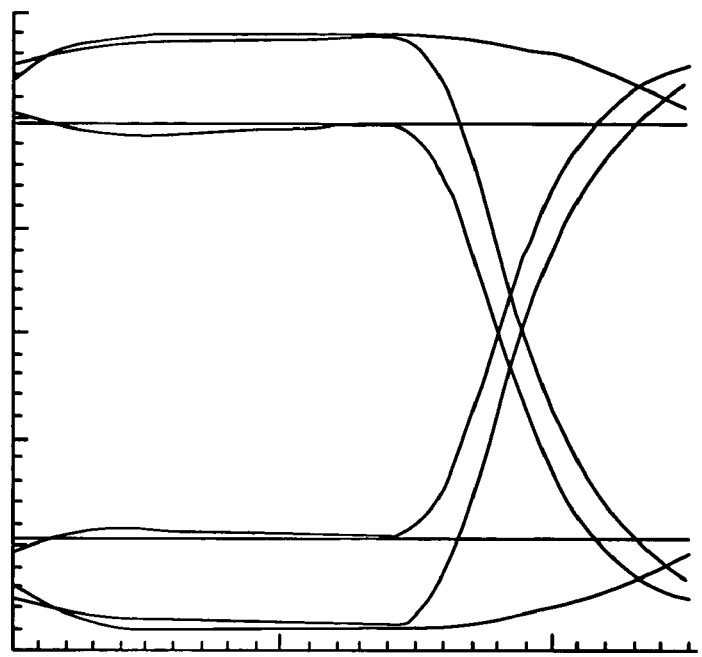
FIG. 9c is an eye diagram of the two output signals of the output driver when C1="H" and C2="L"
Figure 9D:
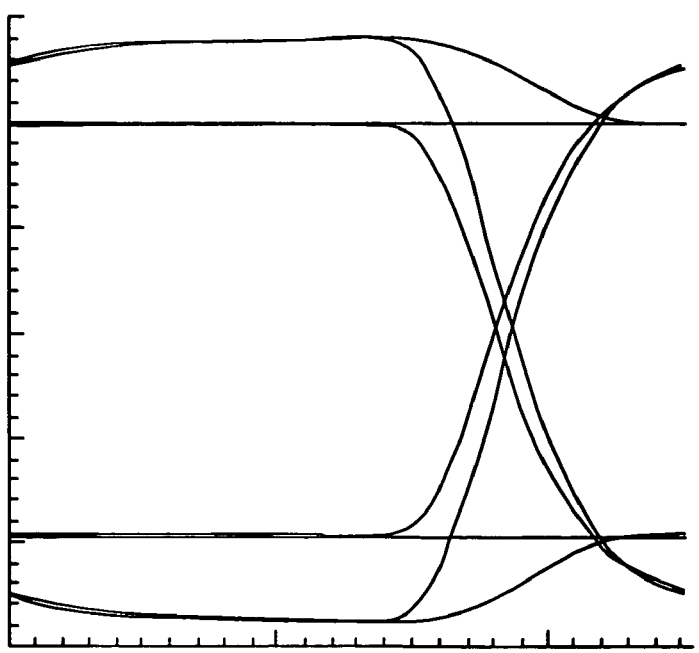
FIG. 9d is an eye diagram of the two output signals of the output driver when C1=C2="H".

FIG. 9A is an eye diagram of the first and second output signals of the output driver 430 when C1=C2="L", FIG. 9B is an eye diagram of the first and second output signals of the output driver 430 when C1="L" and C2="H", FIG. 9C is an eye diagram of the first and second output signals of the output driver 430 when C1="H" and C2="L", and FIG. 9D is an eye diagram of the first and second output signals of the output driver 430 when C1=C2="H".

Referring to FIGS. 9A, 9B, 9C, and 9D, the eye diagram of FIG. 9B is the clearest. In other words, the best pre-emphasis is carried out when C1="L" and C2="H". FIGS. 9A, 9B, 9C, and 9D are simulation results on the assumption that the output driver 430 performs the second pre-emphasis under the same conditions.

As described above, the pre-emphasis circuit according to an exemplary embodiment of the present invention pre-emphasizes input signals to control the slew rates of the input signals and then applies the signals to the output driver. Accordingly, pre-emphasis with a wide control range can be performed and power consumption can be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A pre-emphasis circuit comprising:
   a first buffer buffering first and second main input signals having phases opposite to each other, outputting first and second main output signals, and controlling slew rates of the first and second main output signals using at least one main control signal;
   a second buffer buffering first and second sub-input signals having phases opposite to each other, outputting first and second sub-output signals, and controlling slew rates of the first and second sub-output signals using at least one sub-control signal; and
   an output driver generating first and second output signals having opposite phases using at least two output control signals and the first and second main output signals of the first buffer and the first and second sub-output signals from the second buffer,
   wherein the first sub-input signal is delayed from the first main input signal by one bit and the second sub-input signal is delayed from the second main input signal by one bit, and
   wherein the first buffer comprises:
   a first main input signal processor processing the first main input signal to generate at least two first group gate signals in response to the at least one main control signal;
   a second main input signal processor processing the second main input signal to generate at least two second group gate signals in response to the at least one main control signal;
   a first input stage controlling current flowing through the first load resistor connected to a first terminal thereof in response to the first main input signal and the first group gate signals;
   a second input stage controlling current flowing through the second load resistor connected to a first terminal thereof in response to the second main input signal and the second group gate signals.

2. The pre-emphasis circuit of claim 1, further comprising a control circuit outputting the at least one main control signal, the at least one sub-control signal and the at least two control signals.

3. The pre-emphasis circuit of claim 1, wherein the first buffer further comprises:
   a first load resistor having a first terminal connected to a first power supply and a second terminal connected to a second output terminal outputting the second main output signal;
   a second load resistor having a first terminal connected to the first power supply and a second terminal connected to a first output terminal outputting the first main output signal; and
   a current source receiving currents flowing through the first and second input stages connected to a first terminal thereof and transferring the received currents to a second power supply.

4. The pre-emphasis circuit of claim 3, wherein the first main input signal processor comprises:
   a first resistor having a first terminal connected to a signal line of the first main input signal and a second terminal connected to a signal line of a first gate signal that is one of the first group gate signals;
   a second resistor having a first terminal connected to a second terminal of the first resistor and a second terminal connected to a signal line of a second gate signal that is another of the first group gate signals;
   a first switch switching between the first main input signal and the first gate signal in response to a first main control signal; and
   a second switch switching between the first main input signal and the second gate signal in response to a second main control signal.

5. The pre-emphasis circuit of claim 4, wherein the first input stage comprises:
   a first MOS transistor having a first terminal connected to the second output terminal, a second terminal connected to the current source, and a gate receiving the second gate signal;
   a second MOS transistor having a first terminal connected to the second output terminal, a second terminal connected to the current source, and a gate receiving the first gate signal; and a third MOS transistor having a first terminal connected to the second output terminal, a second terminal connected to the current source, and a gate receiving the first main input signal.

6. The pre-emphasis circuit of claim 5, wherein the first and second switches are composed of transmission gates, and the first, second and third MOS transistors are NMOS transistors.

7. The pre-emphasis circuit of claim 3, wherein the second main input signal processor comprises:
   a third resistor having a first terminal connected to the signal line of the second main input signal and a second terminal connected to a signal line of a third gate signal that is one of the second group gate signals;
   a fourth resistor having a first terminal connected to a second terminal of the third resistor and a second terminal connected to a signal line of a fourth gate signal that is another of the second group gate signals;
   a third switch switching between the second main input signal and the third gate signal in response to a first main control signal; and
   a fourth switch switching between the second main input signal and the fourth gate signal in response to a second main control signal.

8. The pre-emphasis circuit of claim 7, wherein the second input stage comprises:
   a fourth MOS transistor having a first terminal connected to the first output terminal, a second terminal connected to the current source, and a gate receiving the fourth gate signal;
   a fifth MOS transistor having a first terminal connected to the first output terminal, a second terminal connected to the current source, and a gate receiving the third gate signal; and
   a sixth MOS transistor having a first terminal connected to the first output terminal, a second terminal connected to the current source, and a gate receiving the second main input signal.

9. The pre-emphasis circuit of claim 8, wherein the third and fourth switches are composed of transmission gates, and the fourth, fifth and sixth MOS transistors are NMOS transistors.

10. A pre-emphasis circuit comprising:
    a first buffer buffering first and second main input signals having phases opposite to each other, outputting first and second main output signals, and controlling slew rates of the first and second main output signals using at least one main control signal;
    a second buffer buffering first and second sub-input signals having phases opposite to each other, outputting first and second sub-output signals, and controlling slew rates of the first and second sub-output signals using at least one sub-control signal; and
    an output driver generating first and second output signals having opposite phases using at least two output control signals and the first and second main output signals of the first buffer and the first and second sub-output signals from the second buffer,
    wherein the first sub-input signal is delayed from the first main input signal by one bit and the second sub-input signal is delayed from the second main input signal by one bit, and
    wherein the second buffer comprises:
    a first load resistor having a first terminal connected to the first power supply and a second terminal connected to a second output terminal outputting the second sub-output signal;
    a second load resistor having a first terminal connected to the first power supply and a second terminal connected to a first output terminal outputting the first sub-output signal;
    a first sub-input signal processor processing the first sub-input signal to generate at least two first group gate signals in response to the at least one sub-control signal;
    a second sub-input signal processor processing the second sub-input signal to generate at least two second group gate signals in response to the at least one sub-control signal;
    a first input stage controlling current flowing through the first load resistor connected to a first terminal thereof in response to the first group gate signals;
    a second input stage controlling current flowing through the second load resistor connected to a first terminal thereof in response to the second group gate signals; and
    a current source receiving currents flowing through the first and second input stages connected to a first terminal thereof and transferring the received currents to a second power supply.

11. The pre-emphasis circuit of claim 10, wherein the first sub-input signal processor comprises:
    a first resistor having a first terminal connected to a signal line of the first sub-input signal and a second terminal connected to a signal line of a first gate signal that is one of the first group gate signals;
    a second resistor having a first terminal connected to a second terminal of the first resistor and a second terminal connected to a signal line of a second gate signal that is another of the first group gate signals;
    a first switch switching between the first sub-input signal and the first gate signal in response to a first sub-control signal; and
    a second switch switching between the first sub-input signal and the second gate signal in response to a second sub-control signal.

12. The pre-emphasis circuit of claim 11, wherein the first input stage comprises:
    a first MOS transistor having a first terminal connected to the second output terminal, a second terminal connected to the current source, and a gate receiving the second gate signal;
    a second MOS transistor having a first terminal connected to the second output terminal, a second terminal connected to the current source, and a gate receiving the first gate signal; and
    a third MOS transistor having a first terminal connected to the second output terminal, a second terminal connected to the current source, and a gate receiving the first sub-input signal.

13. The pre-emphasis circuit of claim 12, wherein the first and second switches are composed of transmission gates, and the first, second and third MOS transistors are NMOS transistors.

14. The pre-emphasis circuit of claim 10,
    wherein the second sub-input signal processor comprises:
    a third resistor having a first terminal connected to a signal line of the second sub-input signal and a second terminal connected to a signal line of a third gate signal that is one of the second group gate signals;
    a fourth resistor having a first terminal connected to a second terminal of the third resistor and a second terminal connected to a signal line of a fourth gate signal that is another of the second group gate signals;

a third switch switching between the second sub-input signal and the third gate signal in response to a first sub-control signal; and a fourth switch switching between the second sub-input signal and the fourth gate signal in response to a second sub-control signal.

15. The pre-emphasis circuit of claim 14, wherein the second input stage comprises:

a fourth MOS transistor having a first terminal connected to the first output terminal, a second terminal connected to the current source, and a gate receiving the fourth gate signal;

a fifth MOS transistor having a first terminal connected to the first output terminal, a second terminal connected to the current source, and a gate receiving the third gate signal; and a sixth MOS transistor having a first terminal connected to the first output terminal, a second terminal connected to the current source, and a gate receiving the second sub-input signal.

16. The pre-emphasis circuit of claim 15, wherein the third and fourth switches are composed of transmission gates, and the fourth, fifth and sixth MOS transistors are NMOS transistors.

* * * * *